United States Patent [19]

Nakazato et al.

[11] Patent Number: 4,819,055

[45] Date of Patent: Apr. 4, 1989

[54] SEMICONDUCTOR DEVICE HAVING A PN JUNCTION FORMED ON AN INSULATOR FILM

[75] Inventors: Kazuo Nakazato, Hachioji; Tohru Nakamura, Houya; Takao Miyazaki, Hachioji; Nobuyoshi Natsuaki, Higashiyamato; Masahiko Ogirima, Tokyo; Minoru Nagata, Kodaira, all of Japan

[73] Assignee: Hitachi, Ltd., Tokyo, Japan

[21] Appl. No.: 189,382

[22] Filed: May 2, 1988

Related U.S. Application Data

[63] Continuation of Ser. No. 920,905, Oct. 17, 1986, abandoned, which is a continuation of Ser. No. 587,079, Mar. 7, 1984, abandoned.

[30] Foreign Application Priority Data

Mar. 7, 1983 [JP] Japan ................................. 58-35815

[51] Int. Cl.$^4$ ..................... H01L 29/72; H01L 27/12; H01L 29/06; H01L 29/04
[52] U.S. Cl. ......................................... 357/59; 357/34; 357/49; 357/56
[58] Field of Search ................... 357/34, 35, 36, 46, 357/49, 56, 59, 90, 91, 92

[56] References Cited

U.S. PATENT DOCUMENTS

| | | | |
|---|---|---|---|
| 3,796,613 | 3/1974 | Magdo et al. | 357/49 |
| 4,274,891 | 6/1981 | Silvestri et al. | 357/59 |
| 4,303,933 | 12/1981 | Horng et al. | 357/34 |
| 4,433,470 | 2/1984 | Kameyama et al. | 357/59 |
| 4,512,075 | 4/1985 | Uora | 357/59 |
| 4,609,407 | 9/1986 | Masao et al. | 357/91 |

FOREIGN PATENT DOCUMENTS 56-1556 12/1981 Japan .................................. 357/92

OTHER PUBLICATIONS

S. K. Wiedmann, "Status and Trends of I$^2$L/MTL Technology", *IEDM 83* (Dec. 1983) pp. 47–50.
F. Barson, "Improved NPN Process and Structure", *IBM Technical Disclosure Bulletin*, vol. 23, No. 9, (Feb. 1981) pp. 4166–4167.
A. S. Grove, *Physics and Technology of Semiconductor Devices*, John Wiley & Sons, New York (1967) pp. 78–83.

Primary Examiner—J. Carroll
Attorney, Agent, or Firm—Antonelli, Terry & Wands

[57] ABSTRACT

The invention deals with a semiconductor device which comprises a semiconductor substrate of a first conductivity type, a semiconductor region formed on said substrate, and a first insulation film provided between said semiconductor region and said semiconductor substrate, wherein said semiconductor substrate is isolated by said insulation film from a polycrystalline silicon layer formed in the periphery of said semiconductor region thereby to reduce the parasitic capacitance, and wherein said insulation film is stretched and arranged on the lower side of said semiconductor region.

2 Claims, 8 Drawing Sheets

SEMICONDUCTOR DEVICE HAVING A PN JUNCTION FORMED ON AN INSULATOR FILM

This is a continuation of application Ser. No. 920,905, filed Oct. 17, 1986, which is a continuation application of Ser. No. 587,079, filed Mar. 7, 1984, now both abandoned.

BACKGROUND OF THE INVENTION

The present invention relates to a semiconductor device structure, and more particularly to a semiconductor device structure which can be effectively adapted to bipolar transistors in a very small integrated circuit, which exhibits a very high switching speed, which dissipates very small electric power, and which has a high breakdown voltage.

A conventional representative structure of bipolar transistors is shown in FIG. 1, in which reference numeral 11 denotes a silicon substrate of p conductivity type, and 12a, 12b represent $n^+$-type buried layers. The $n^+$-type buried layer 12a is connected as a base electrode of a lateral pnp transistor to an electrode 18e via an $n^+$-type contact region 13, and the $n^+$-type buried layer 12b is connected as a collector electrode of a vertical npn transistor to the electrode 18e via the $n^+$-type contact region 13. The lateral pnp transistor is formed by using a p-type region 15a as an emitter, p-type region 15b as a collector, and n-type region 14a as a base. The vertical npn transistor is also formed by using an $n^+$-type region 16 as an emitter, p-type region 15c as a base, and n-type region 14b as a collector. Reference numeral 17 denotes an isolation region.

In the device of FIG. 1, parasitic regions unnecessary for the transistor action, i.e., regions under the electrodes 18a, 18b and 18c, occupy more than 80% of the total areas to considerably deteriorate the characteristics of the transistors.

Namely, in the lateral pnp transistor, an excess emitter current and base current flow through an emitter-base junction under the emitter electrode 18a, so that the consumption of electric power increases and the current gain decreases. Further, the hole charge is stored in large amounts in the base region 14a to strikingly deteriorate high-frequency characteristics. In the vertical npn transistor, on the other hand, the capacitance of base-collector junction increases under the base electrode 18c to increase the propagation delay time of the logic circuit. Moreover, when the vertical npn transistor is operated in the reverse direction so that the emitter comes to the substrate side, the region under the base electrode 18c works as a parasitic diode which deteriorates the current gain and high-frequency characteristics. That is, when the vertical npn transistor is operated in the reverse direction, the injection efficiency from the emitter 12b (the collector in the forward operation becomes the emitter in the reverse operation) decreases. Therefore, the presence of these parasitic regions markedly deteriorates the performance of the npn transistors when they are operated in the reverse direction or operated in saturation mode such as in an I²L (integrated injection logic) circuit or in a TTL (transistor-transistor logic) circuit.

FIG. 2 shows another conventional bipolar transistor structure which is free from the above-mentioned defects. According to this example, an oxide film 120 is inserted in the parasitic regions to reduce the dissipation of electric power and to gain a high switching speed. In FIG. 2, reference numeral 121 denotes a polycrystalline silicon containing p-type impurities at a high concentration. An emitter region 15a and a collector region 15b of the lateral pnp transistor, as well as a graft base region 15c of the vertical npn transistor, are formed by the diffusion of p-type impurities from the polycrystalline silicon. Reference numeral 19 denotes a p-type intrinsic base region formed by the ion implantation method or the like.

The above-mentioned technique has been disclosed in U.S. Patent Application Nos. 158,366 (June 11, 1980), 435,552 (Oct. 21, 1982) and 527,846 (Aug. 30, 1983).

SUMMARY OF THE INVENTION

The inventors, however, have discovered the fact that the structures disclosed in the above-mentioned patent applications still have defects as described below, although their performance is considerably improved compared with the performance of the aforementioned first conventional structure.

(1) The regions 15a, 15b and 15c and the buried layer 12 often come into contact with each other, giving rise to the occurrence of failure on breakdown voltage and leakage of current, and causing high-frequency characteristics to be deteriorated. In particular, I²L circuits and similar circuits will be seriously affected, when the n-type layer 14 has a reduced thickness so that the hole charge is stored in reduced amounts.

(2) In the vertical npn transistor, the performance deteriorates just like in (1) above, since the graft base 15c comes into contact with the emitter region 16.

(3) The contacting portion between the emitter and the graft base 15c of the vertical npn transistor must be located under the oxide film 122 which is formed on the surface of the substrate. If the contacting portion between the emitter and base is not completely covered by the oxide film 122, this contacting portion will also contact the emitter electrode 18d, and an emitter-base short will develop. On the other hand, if the contacting portion between the emitter and base comes into contact with the polycrystalline silicon which serves as a base electrode, the current gain decreases due to the difference in built-in potential at the PN junction between a single crystal and a polycrystal.

The contacting portion between the emitter and the base in the vertical npn transistor can be controlled by precisely controlling the oxide film 122 on the substrate surface and by controlling the graft base 15c to be formed exactly as shown in FIG. 2. In practice, however, this is very difficult to do.

The object of the present invention is to provide a semiconductor device which is free from the aforementioned defects, and which features a high packing density and improved high-frequency characteristics.

To achieve the above-mentioned object according to the present invention, the upper and lower side surfaces of the graft base 15c and the regions 15a and 15b are covered by an insulator. Namely, according to the present invention, the contact surface between a single crystalline semiconductor region in which the elements will be formed and a polycrystalline region from where the electrode will be drawn, bite deeply into the insulator.

Relying upon the above-mentioned structure, there is provided a bipolar semiconductor device which features markedly reduced base resistance and parasitic capacitance.

DETAILED DESCRIPTION OF THE INVENTION

Embodiments of the invention will be described below in conjunction with the drawings.

Figure 1:
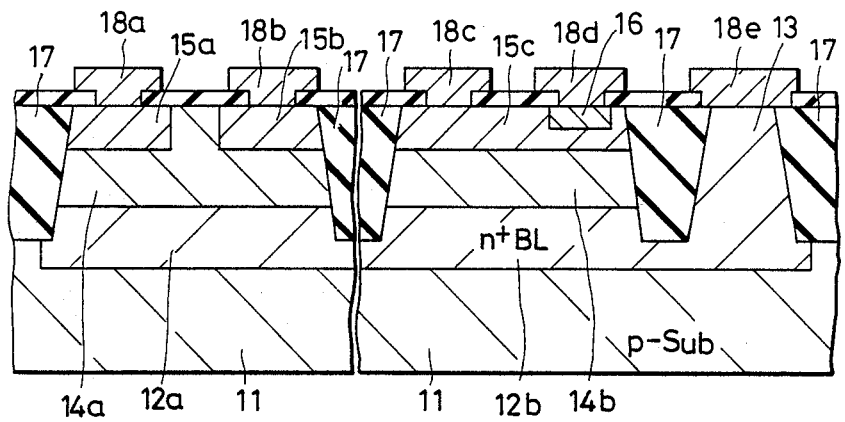
FIG. 1 is a section view showing the structure of a conventional lateral transistor and a conventional vertical transistor.
Figure 2:
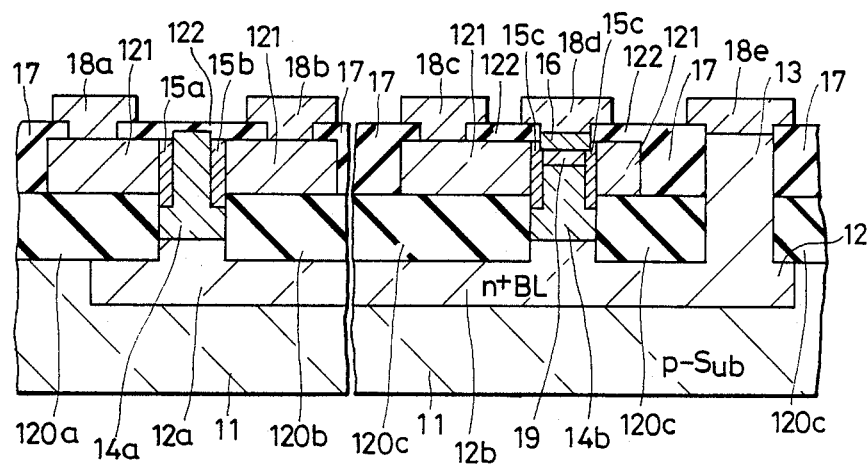
FIG. 2 is a section view showing the structure of a more evolved conventional transistor which is less affected by the parasitic effect.
Figure 3:
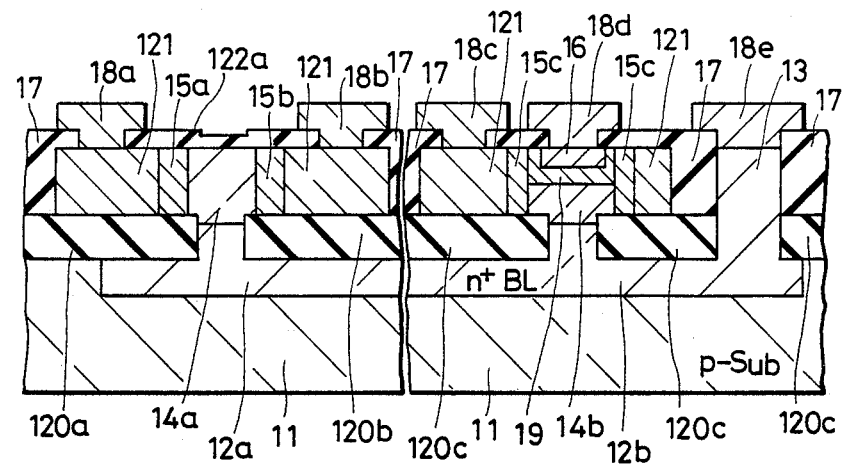
FIG. 3 is a section view showing the structure of a lateral transistor and a vertical transistor according to an embodiment of the present invention.

FIG. 3 is a section view showing the structure of a first bipolar semiconductor device and a second bipolar semiconductor device according to an embodiment of the present invention. To clearly describe the invention, reference numerals and conductivity types used in the above-mentioned conventional examples of FIGS. 1 and 2 are also used in the description, unless otherwise stated. In FIG. 3, reference numeral I denotes a lateral transistor, and II denotes a vertical transistor. In the structure of FIG. 3, the single crystalline semiconductor regions such as 14a, 14b and 19 occupy greater areas than the openings of silicon dioxide film, and the upper and lower side surfaces of the graft regions 15a, 15b and 15c are covered by an insulator. Therefore, these regions do not come into contact with the buried layer 12, and the aforementioned defect (1) is precluded. Owing to the oxide film 122 on the graft base 15c, furthermore, the pn junction is easily formed, and the aforementioned defect (3) is eliminated. Also, it is noted that the contacting surface between the regions 15a, 15b and 15c and the polycrystalline regions 121 adjoining them are spaced from the openings in the oxide film 120. By way of example, the spacing can be between 0.5 to 1.0 microns, but the invention is not limited to this range.

Figure 4:
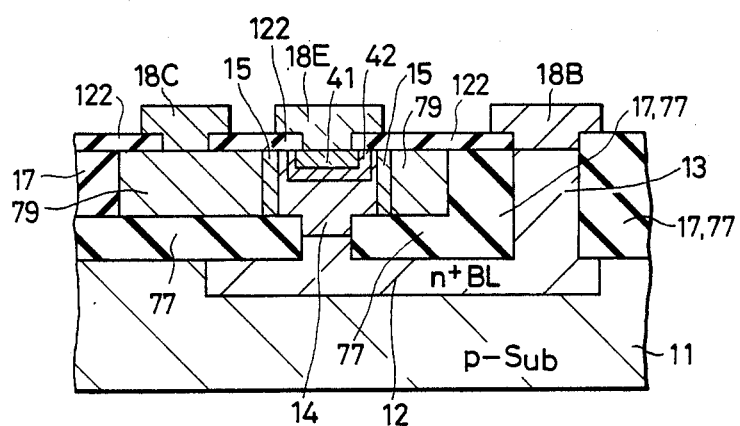
FIG. 4 is a section view showing the structure of a vertical/lateral type transistor according to another embodiment of the present invention.

FIG. 4 is a section view showing the structure of a third bipolar semiconductor device according to another embodiment of the present invention, wherein n-type regions 42 and 14 serve as bases, p-type region 41 serves as an emitter, and p-type region 15 serves as a collector. Although two regions 15 are shown, it is to be understood that these are actually connected to one another outside of the cross-sectional view of FIG. 4 to form the collector. According to the structure of this embodiment in which the base width is narrower than that of the lateral transistor I of FIG. 3, the high-frequency characteristics are improved, and the impurity concentration in the base of the region 42 is increased to prevent the reduction of current gain on the higher current side that will be caused by a high injection effect. According to this embodiment, a large single crystalline region 14 is formed under the oxide film 122, and a sufficient margin is offered for forming the emitter junction and the collector junction. In FIG. 4, reference numeral 18B denotes a base electrode, 18E denotes an emitter electrode, and 18C denotes a collector electrode. Numeral 77 denotes an oxide layer and 79 denotes a polycrystalline silicon layer.

Figure 5:
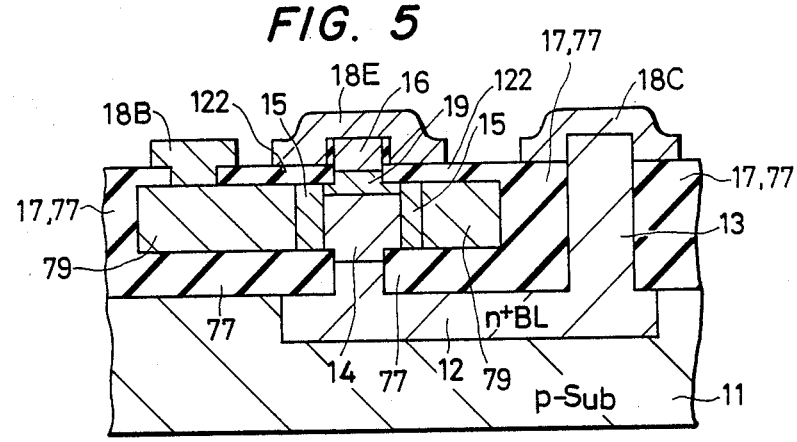
FIG. 5 is a section view showing the structure of a vertical transistor according to a further embodiment of the present invention.

FIG. 5 is a section view showing the structure of a fourth bipolar semiconductor device formed as a vertical npn transistor according to a further embodiment of the present invention. In this embodiment, the single crystal is formed above the oxide film 122, and the emitter region 16 is formed therein. Side walls of the emitter region are covered by an insulation film. Therefore, the graft base 15 does not come into contact with the emitter region 16, and the aforementioned defect (2) is eliminated more reliably. In FIG. 5, reference number 14 denotes a collector region, 13 denotes a region for taking out the collector electrode, 18C denotes the collector electrode, 18E denotes an emitter electrode, and 18B denotes a base electrode.

Described below is a manufacturing method according to embodiments of the present invention. FIGS. 6A to 6M illustrate an embodiment for manufacturing the first and second semiconductor devices such as the lateral transistor I and the vertical transistor II shown in FIG. 3.

Figure 6A:
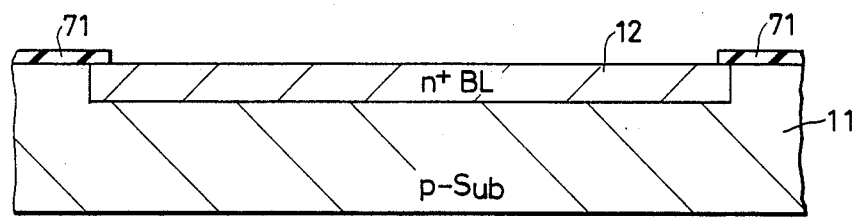
FIGS. 6A to 6M are diagrams of steps for manufacturing a semiconductor device according to the present invention.

FIG. 6A: A silicon substrate of p conductivity type is prepared. On the other hand, if desired, the substrate may be of the n-type. In this case, however, the impurities must possess the opposite type of conductivity. Further, instead of using an electrically conductive material, the substrate may be one of the type in which an electrically conductive material is placed on an insulator, as represented by an SOI (silicon on insulator) or SOS (silicon on sapphire), or the like.

The inventors have employed the substrate containing the impurities of the p-type at a concentration of $5 \times 10^{14}$/cm$^3$.

The substrate was thermally oxidized to form a thin silicon dioxide film 71 on the surface of the substrate. The inventors have effected the thermal oxidation at a temperature of 1000° C. for 150 minutes to obtain a silicon dioxide film which was 600 nm thick.

Then, relying upon the customarily employed photolithographic technology, an opening is formed in the silicon dioxide film 71 in order to form an n$^+$-type buried layer (n$^+$BL) 12 of a high concentration.

The n$^+$-type buried layer (n$^+$BL) 12 having a desired impurity concentration is formed through the opening relying upon the diffusion or ion implantation technique. When the ion implantation technique is employed, thermal annealing is usually effected. According to the present invention, however, the step of thermal treatment is not particularly required, since the same effect is imparted to the ion-implanted layer in a subsequent step.

Figure 6B:
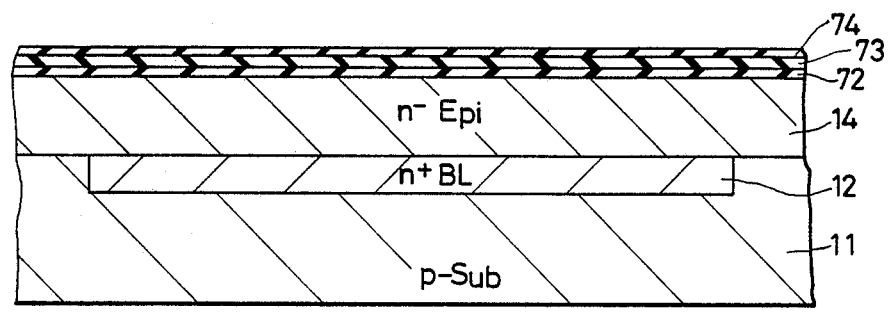

FIG. 6B: Then, the silicon dioxide film 71 is removed to expose the surface of the substrate, and an n-type single crystalline layer (n-Epi) 14 is formed by the epitaxially growing method. The epitaxial layer 14 can be formed in any desired thickness by adjusting the growing time and the temperature. The inventors have obtained the epitaxial layer 14 that was 1 μm thick.

Next, a silicon dioxide film 72 is formed by thermal oxidation. Deposition process also could be use.

Thereafter, a silicon nitride film 73 is formed by deposition. A silicon dioxide film 74 is then formed by deposition. The inventors have formed three layers, i.e., silicon dioxide film 72, silicon nitride film 73 and silicon dioxide film 74 having thicknesses of 50 nm, 120 nm and 900 nm, respectively.

Figure 6C:
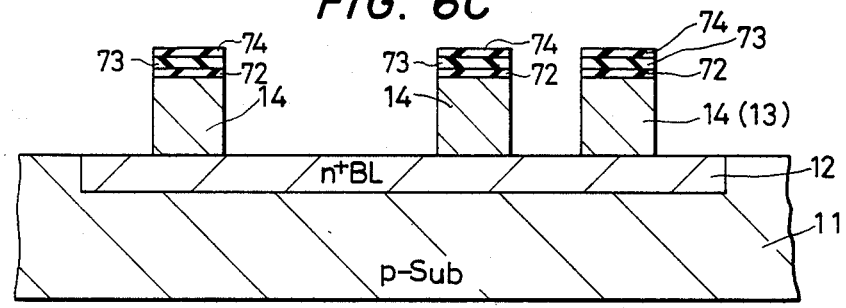

FIG. 6C: The epitaxially grown layer is then subjected to the etching leaving the region 14 for forming elements and the region 13 for taking out the electrode, in order to form protruded regions. Since the protruded regions are formed by the anisotropic dry etching, almost no side etching takes place.

Figure 6D:
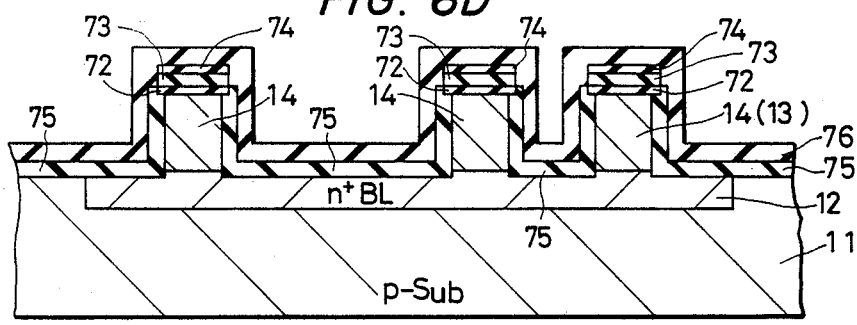

FIG. 6D: A silicon dioxide film 75 is formed again by similar process for film 72. In this case, however, the film 75 may have a slightly different shape. Then, a silicon nitride film 76 is formed thereon by deposition. The inventors have formed the silicon dioxide film and the silicon nitride film having thicknesses of 50 nm and 120 nm, respectively.

Figure 6E:
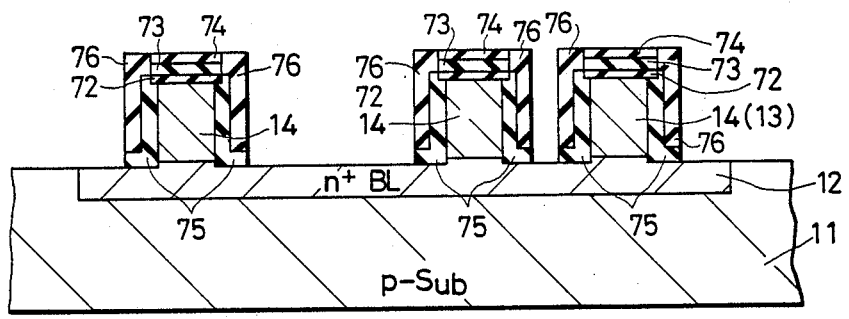

FIG. 6E: Then, the anisotropic dry etching is effected in such a manner that the silicon nitride film 76 is left only on the side surfaces of the region 14 for forming elements and of the region 13 for taking out the electrode. No photomask is required for effecting the anisotropic dry etching.

Figure 6F:
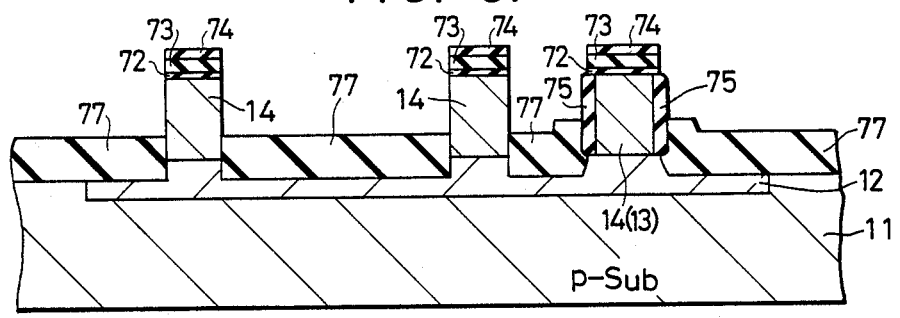

FIG. 6F: The thermal oxidation is then effected using the silicon nitride film 76 as a mask, thereby to form a thick oxide film 77. The inventors have formed the oxide film that was 700 nm thick.

Then, the silicon nitride film 76 is removed and, then, the silicon dioxide film 75 is removed. When the silicon dioxide film is to be removed, the side surfaces of the region 13 for taking out the electrode are covered by a relaxed mask so that the silicon dioxide film 75 is not removed from the side surfaces. Accordingly, the silicon dioxide film 75 is not removed from the covered surfaces.

Figure 6G:
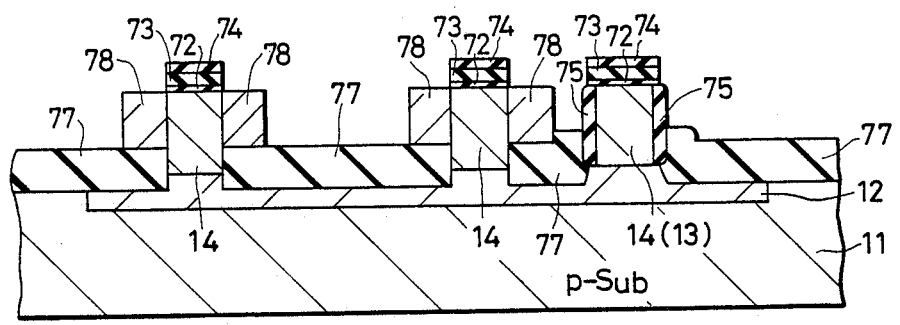

FIG. 6G: An epitaxial layer 78 is formed by the selective epitaxially growing method on only the surfaces where the single crystal is exposed in the regions for forming elements. According to this method, the single crystalline layer can be formed on the desired portions only but not on the silicon dioxide film, by suitably selecting the atmosphere. The inventors have formed the single crystalline layer 78 at a temperature of 850° C. by using an SiCl4 gas. The art related to this method has been closely disclosed in Japanese Patent Laid-Open No. 126259/1978.

Figure 6H:
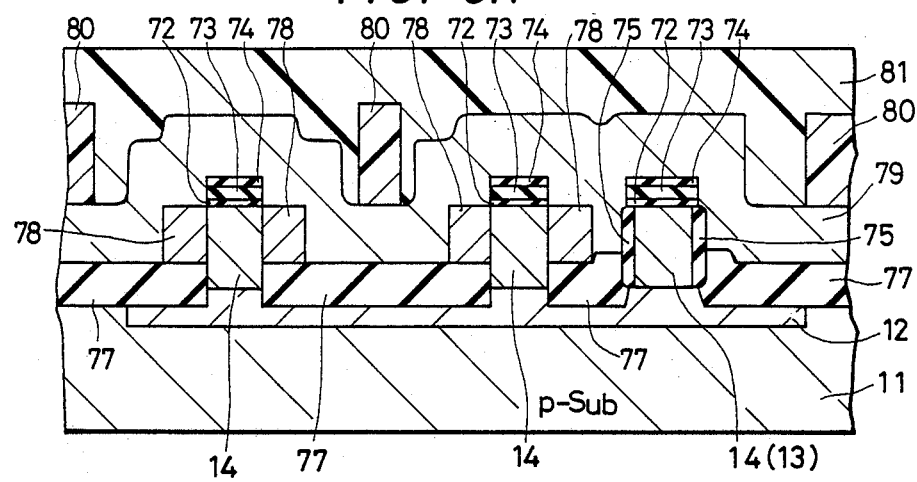

FIG. 6H: A polycrystalline silicon layer 79 is deposited on the whole surface.

To remove unnecessary portions of the polycrystalline silicon layer 79, the surface of the substrate for forming elements is made flat by using a photoresist film. The inventors have made the surface flat by using two photoresists 80, 81.

The photoresist 80 formed earlier should not be dissolved by the photoresist 81 that is formed later. This makes it possible to obtain a sufficiently flat surface with a minimum thickness of photoresist films.

Figure 6I:
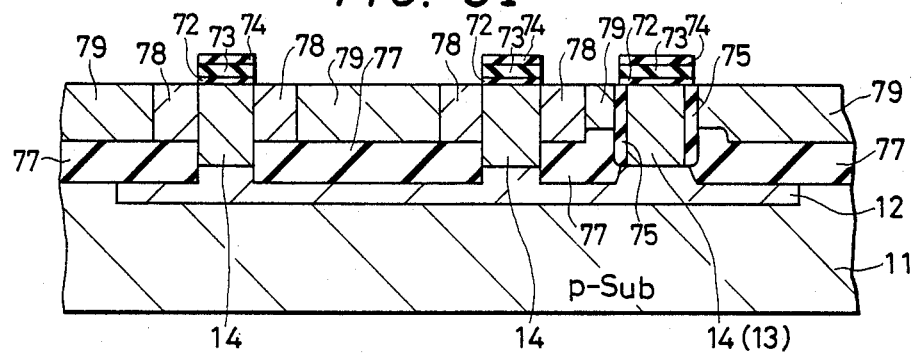

FIG. 6I: The anisotropic dry etching is effected up to the portions corresponding to the regions for forming elements.

Figure 6J:
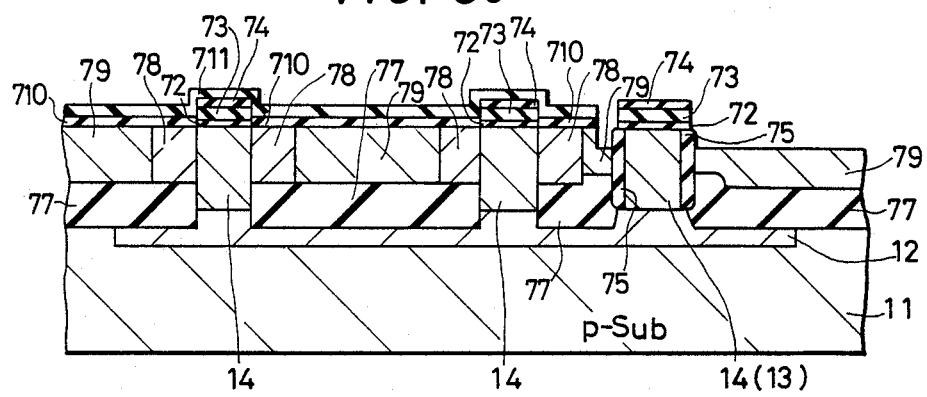
Figure 6K:
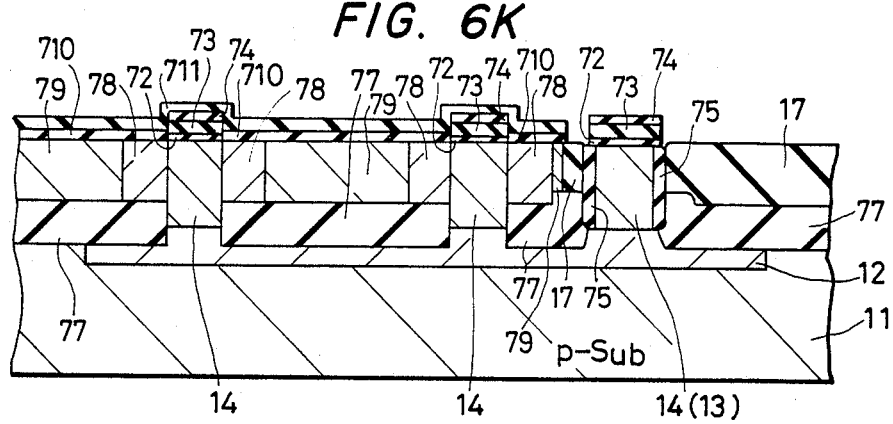

FIG. 6J: A silicon dioxide film 710 is formed by the thermal oxidation method or by deposition. A silicon nitride film 711 is then formed by deposition. The inventors have formed these films in thicknesses or 30 nm and 120 nm, respectively. In order to isolate the elements, furthermore, desired portions of the polycrystalline silicon layer 79 are oxidized to form silicon dioxide film. In this case, the thickness of the polycrystalline silicon layer of the portions to be oxidized should have been reduced to one-half beforehand by etching, so that the thickness after the oxidation will become nearly the same as the thickness of other polycrystalline silicon portions, and so that a flat surface is obtained. This is favorable for forming wirings on the element-forming region. Namely, if the elements have flat surfaces, the wirings are broken less when they are being formed. Then, the structure shown in FIG. 6K is obtained through the oxidation.

Figure 6L:
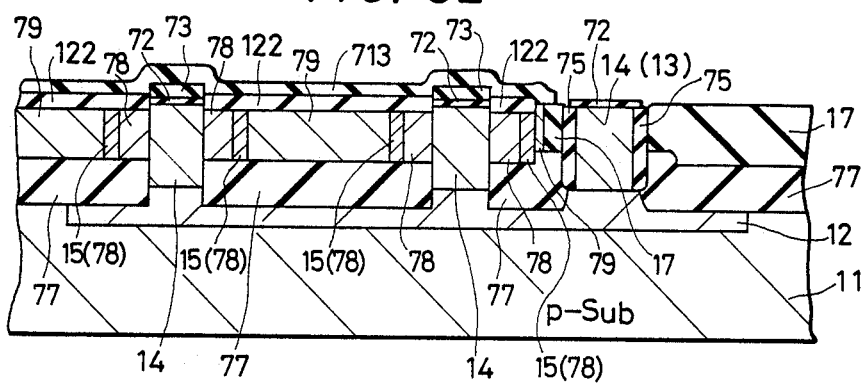

FIG. 6L: Next, the silicon dioxide film 710 and the silicon nitride film 711 are removed, and boron ions are implanted into the polycrystalline silicon layer 79. Then, a silicon dioxide film 122 is formed by thermal oxidation. A silicon nitride film 713 is then formed by deposition, and the silicon nitride films 713, 73 are removed from the portion 13 where an n-type high-concentration region is to be formed. The surface of the silicon dioxide film 17 is little affected by the implantation of ions, and only a roughly shaped mask needs be employed.

Figure 6M:
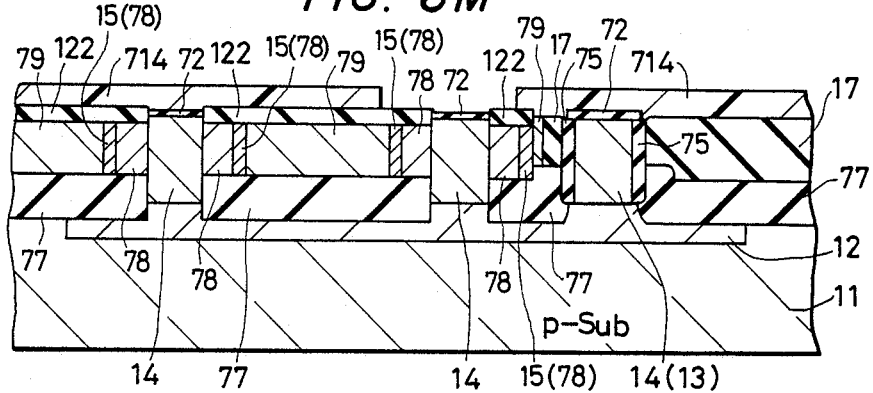

FIG. 6M: After the silicon nitride film 713 is removed, impurity ions are implanted or are introduced by diffusion via a photoresist 714 to form a base region and an emitter region in the exposed region 14 to form a vertical transistor such as that shown by II in FIG. 3. The unexposed transistor on the left of FIG. 6M serves as the lateral transistor I of FIG. 3.

By subsequently providing the electrodes such as of base, emitter and collector, the structure which is shown in FIG. 3 will be obtained.

In FIG. 3, the laterial transistor and the vertical transistors are formed separately. In FIGS. 6A to 6M, however, the collector of the lateral transistor and the base of the vertical transistor are connected to each other through the same polycrystalline silicon layer. Which structure should be employed has no relation to the nature of the invention, and should be determined depending upon the application.

The above-mentioned manufacturing method has employed the anisotropic dry etching method. Generally, however, the dry etching method is susceptible to contamination. To prevent the contamination, therefore, it is recommended to add a step for cleaning the surface after the step of dry etching, to obtain good results.

Figure 7A:
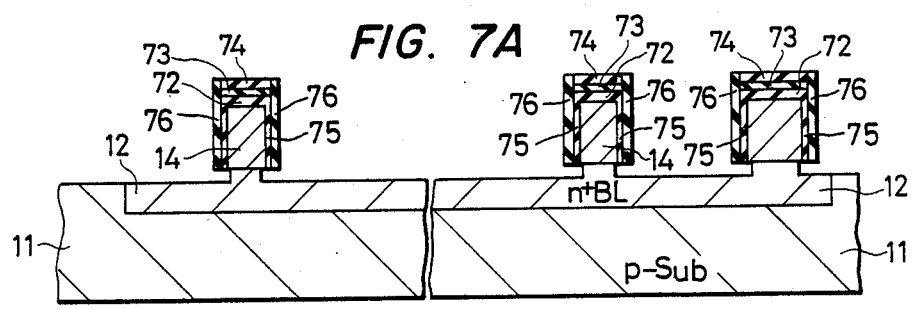
FIGS. 7A to 7C are diagrams illustrating characteristic steps for manufacturing another semiconductor device according to the present invention.
Figure 7B:
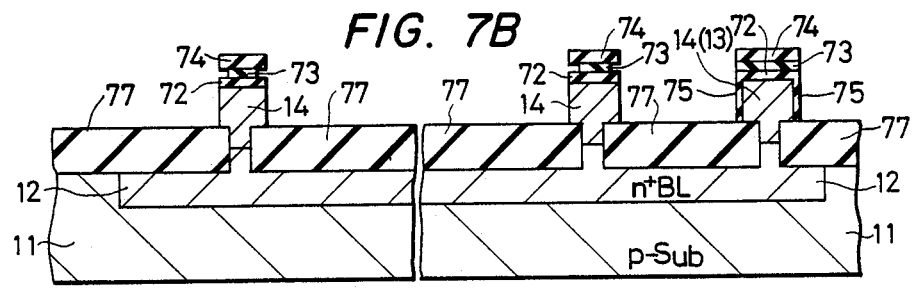
Figure 7C:
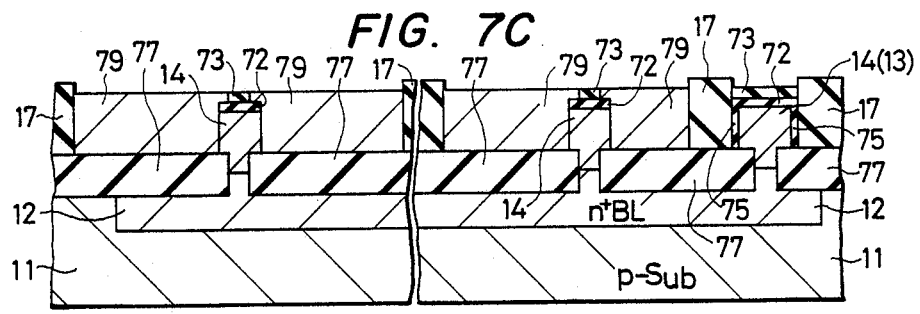

FIGS. 7A to 7C illustrate manufacturing steps which are different from the method of manufacturing the first and second semiconductor devices of the present invention described above, and can be used to form the third semiconductor device shown in FIG. 4 if desired.

FIG. 7A: After the steps of FIGS. 6A to 6E, the single crystalline substrate is subjected to the isotropic etching.

FIG. 7B: An oxide film 77 is formed with the silicon nitride film 76 as a mask. The silicon nitride film 76 is then removed, and the oxide film 75 and portions of the silicon nitride film 73 are removed through patterning using a roughly shaped mask.

FIG. 7C: A polycrystalline silicon layer 79 is formed by deposition. The portions of the polycrystalline silicon layer above the protruded portions are subjected to the etching. Any desired shape can be obtained by the method shown in FIG. 6H without the need of matching the mask. Thereafter, portions of the polycrystalline silicon layer are oxidized, and the silicon dioxide film 74 is removed. The steps subsequent to the step of FIG. 6L can then be carried out if desired to obtain the structure shown in FIG. 3.

On the other hand, the structure shown in FIG. 7C can be developed through subsequent steps to form the device of FIG. 4 with the N region 14 being used as a base rather than a collector and with N region 42 and P region 41 in place of the P region 19 and N region 16 of FIG. 3. In this case, phosphorus ions are injected and then boron ions are injected to the third semiconductor device of the present invention developed by steps similar to those leading to FIG. 6M, thereby to obtain the structure which is shown in FIG. 4.

Figure 8A:
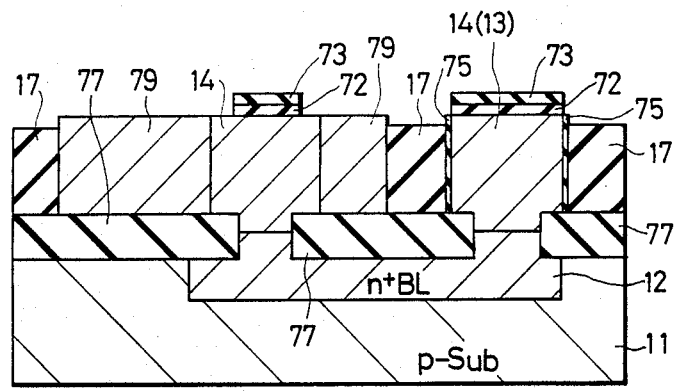
FIGS. 8A to 8C are diagrams illustrating characteristic steps for manufacturing a further semiconductor device according to the present invention.
Figure 8B:
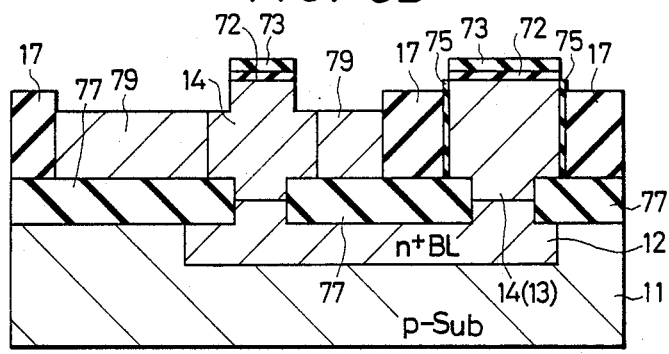
Figure 8C:
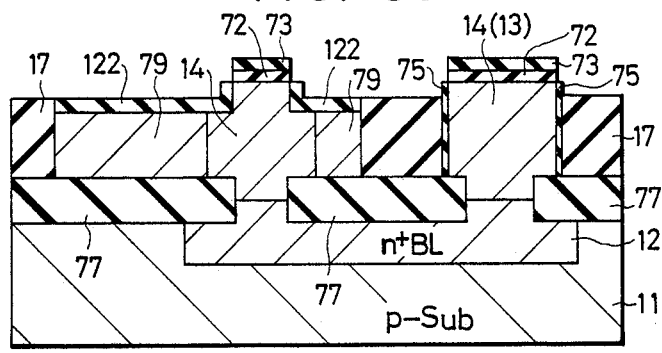

FIGS. 8A to 8C illustrate the steps for manufacturing a fourth semiconductor device of the present invention, and illustrate the structure in cross section before the strcuture of FIG. 5 is obtained.

FIG. 8A: After the steps of FIGS. 7A to 7C, portions of the oxide film 72 are removed with the silicon nitride film 73 as a mask.

FIG. 8B: Surfaces of the polycrystalline silicon layer and the epitaxial layer are subjected to the selective etching by using the oxide film or the silicon nitride film 73 and the silicon dioxide film 17 as masks.

FIG. 8C: Exposed portions of the polycrystalline silicon layer and the epitaxial layer are thermally oxidized.

Thereafter, impurities are introduced into desired portions to obtain the structure of FIG. 5.

In the above-mentioned embodiments 1 to 4, the insulator is formed by thermally oxidizing the silicon, or is composed of a silicon nitride film, or is composed of an insulating material. The device of the invention can also be realized by using other semiconductor materials such as GaAs and the like. In the embodiments of the present invention, furthermore, the conductivity types, i.e., p-type and n-type can be reversed. In the embodiments of the invention, moreover, gallium ions and arsenic ions can be used instead of boron ions and phosphorus ions.

According to the present invention, the graft base layer of a high concentration does not come into contact with the emitter and collector regions, and it is made possible to realize a bipolar transistor which features reduced parasitic capacitance, increased breakdown voltage, and small noise. In particular, it is allowed to easily form a shallow junction and a thin epitaxial layer, and hence to realize a bipolar transistor which exhibits a switching speed of two or more times faster than that of the conventional devices.

Although the invention has been described in its preferred form with a certain degree of particularity, it should be understood that the present disclosure of the preferred form can be changed in the details of construction and the combination and arrangement of parts may be resorted to without departing from the spirit and scope of the invention as hereinafter claimed.

What is claimed is:

1. A semiconductor device including a vertical bipolar transistor which comprises:
   a semiconductor substrate of a first type of conductivity;
   a highly doped region having a second type of conductivity, said highly doped region being formed in said substrate;
   an insulation film which is formed on said substrate and which has an opening through which at least one portion of said highly doped region extends;
   a first single crystal semiconductor region having the second conductivity type which is formed on said insulation film and which is electrically connected to said highly doped region through said opening, wherein said first single crystal semiconductor region has an impurity region of the second type of conductivity adjacent to an upper surface of said first single crystal semiconductor region, thereby to form an emitter or a collector for said bipolar transistor, and has an impurity region of the first type of conductivity which surrounds said impurity region of the second type of conductivity thereby to form a base region for said bipolar transistor, and wherein a portion of the first single crystal semiconductor region of the second type of conductivity in contact with said highly doped region forms a collector or an emitter, said portion of the first single crystal semiconductor region having an impurity concentration which is less than that of the highly doped region;
   a polycrystalline silicon layer having the first conductivity type which is formed to electrically contact an outer periphery of said first single crystal semiconductor region; and
   a graft region which is formed in a portion of said first single crystal semiconductor region between polycrystalline silicon layer and the base and collector regions formed in the first single crystal semiconductor region, wherein said graft region is formed by diffusion from said polycrystalline silicon layer into the first single crystal semiconductor region,
   wherein a first contacting surface between said graft region and said polycrystalline silicon layer exists on said insulation film at a location spaced away from said opening so that said first contacting surface does not come within said opening, and further
   wherein a second contacting surface between said graft region and said collector region formed in said first single crystal semiconductor region adjoining said graft region exists on said insulation film at a location spaced away from said opening so that said second contacting surface does not come within said opening to thereby prevent direct physical contact between said graft region and said highly doped region and to prevent downward diffusion from the graft region towards said highly doped region.

2. A semiconductor region according to claim 1, wherein at least a portion of said first single crystal semiconductor region exists above an upper surface of said polycrystalline silicon layer.

* * * * *